United States Patent
Allen (10) Patent No.: US 7,297,895 B2
(45) Date of Patent: Nov. 20, 2007

(54) APPARATUS FOR REMOVAL OF MINUTE PARTICLES FROM A SURFACE USING THERMOPHORESIS TO PREVENT PARTICLE REDEPOSITION

(75) Inventor: Susan Davis Allen, Tallahassee, FL (US)

(73) Assignee: Arkansas State University, State University, AK (US)

( * ) Notice: Subject to any disclaimer, the term of this patent is extended or adjusted under 35 U.S.C. 154(b) by 0 days.

(21) Appl. No.: 10/966,029

(22) Filed: Oct. 18, 2004

(65) Prior Publication Data

US 2005/0103359 A1   May 19, 2005

Related U.S. Application Data

(63) Continuation of application No. 09/909,992, filed on Jul. 23, 2001, now Pat. No. 6,805,751.

(51) Int. Cl.
*B23K 26/00* (2006.01)
(52) U.S. Cl. .............. 219/121.6; 219/121.84; 156/345.5; 156/345.51; 156/345.52; 134/105
(58) Field of Classification Search ........ 219/60, 219/65, 121.6, 121.84; 134/902, 105; 156/345.5, 156/345.51
See application file for complete search history.

(56) References Cited

U.S. PATENT DOCUMENTS

| | | |
|---|---|---|
| 4,720,621 A | 1/1988 | Langen |
| 4,752,668 A | 6/1988 | Rosenfield et al. |
| 4,987,286 A | 1/1991 | Allen |
| 5,023,424 A | 6/1991 | Vaught |
| 5,151,135 A | 9/1992 | Magee et al. |
| 5,332,879 A | 7/1994 | Radhakrishnan et al. |
| 5,373,806 A | 12/1994 | Logar |
| 5,516,369 A | 5/1996 | Lur et al. |
| 5,531,857 A | 7/1996 | Engelsberg et al. |
| 5,531,862 A | 7/1996 | Otsubo et al. |
| 5,601,737 A * | 2/1997 | Asahi et al. ........... 219/121.66 |
| 5,637,245 A | 6/1997 | Shelton et al. |
| 5,643,472 A | 7/1997 | Engelsberg et al. |
| 5,800,625 A | 9/1998 | Engelsberg et al. |
| 5,821,175 A | 10/1998 | Engelsberg |
| 5,950,071 A | 9/1999 | Hammond et al. |
| 5,958,145 A * | 9/1999 | Yonemizu et al. ............. 134/2 |
| 5,958,268 A | 9/1999 | Engelsberg et al. |
| 6,048,588 A | 4/2000 | Engelsberg |
| 6,056,827 A | 5/2000 | Fukui et al. |

(Continued)

OTHER PUBLICATIONS

S.D. Allen, J.O. Porteus and W.N. Faith, Infrared laser-induced desorption of $H_2O$ and hydrocarbons from optical surfaces, Appl. Phys. Lett. vol. 41(5), pp. 416-418 (1982).

(Continued)

*Primary Examiner*—M. Kornakov
(74) *Attorney, Agent, or Firm*—The Fleshner Group, PLLC (57) ABSTRACT

A method and apparatus for removing minute particles from a surface of a sample are provided that prevent redeposition of the particles onto the surface. By combining thermophoresis with laser assisted particle removal (LAPR), the methods and apparatus remove minute particles (for example, micrometer and nanometer sizes) and assure that they will not redeposit.

5 Claims, 5 Drawing Sheets

U.S. PATENT DOCUMENTS 6,064,035 A      5/2000    Toller et al.

OTHER PUBLICATIONS

S.D. Allen, J.O. Porteus, W.N. Faith, and J.B. Franck, Contaminant and defect analysis of optical surfaces by infrared laser induced desorption, Appl. Phys. Lett. vol. 45(9), pp. 997-999 (1984).

J.O. Porteus, J.B. Franck, S.C. Seitel and S.D. Allen, Defect characteristics of optical surfaces using pulsed laser damage methods, Optical Engineering vol. 25, No. 10, pp. 1171-1176 (1986).

W. Zapka, W. Ziemlich and A.C. Tam, Efficient pulsed laser removal of 0.2μm sized particles from a solid surface, Appl. Phys. Lett. vol. 58 (20), pp. 2217-2219 (1991).

M. Genut, B. Livshits, Y. Uziel, O. Tehar-Zahav, E. Iskevitch, I. Barzilay, Laser removal of foreign materials from semiconductor wafers, Proc. SPIE vol. 3274, pp. 90-99 (1998).

D. Yogev, M. Engel, S. Zeid, I. Barzilay, and B. Livshits, Laser chemical process for clean applications in semiconductor manufacturing, Proc. SPIE 3933, pp. 77-87 (2000).

J.D. Kelley, M.I. Stuff, F.E. Hovis and G.J. Linford, Removal of small particles from surfaces by pulsed laser irradiation: observations and a mechanism, Proc. SPIE 1415, pp. 211-219 (1991).

Y.F. Lu, W.D. Song, C.K. Tee, D.S-H. Chan, and T.S. Low, Wavelength effects in the laser cleaning process, Jpn. J. Appl. Phys. vol. 37, pp. 840-844 (1998).

V. Dobler, R. Oltra, J.P. Boquillon, M. Mosbacher, J. Boneberg and P. Leiderer, Surface acceleration during dry laser cleaning of silicon, Appl. Phys. A 69, pp. S335-S339 (1999).

M. She, Dongsik Kim and C.P. Grigoropoulos. Liquid-assisted pulsed laser cleaning using near-infrared and ultraviolet radiation, J. Appl. Phys. vol. 86, No. 11, pp. 6519-6524 (1999).

A. Miller, S.J. Lee, S.D. Allen, Laser assisted particle removal "dry" cleaning of critical surfaces, Mater. Sci. Eng. B49, pp. 85-88 (1997).

C.T. Avedisian, The Homogeneous Nucleation of Limits of Liquids, J. Phys. Chem. Ref. Data vol. 14, No. 3, pp. 695-729 (1985).

O. Yavas, P. Leiderer, H.K. Park, C.P. Grigoropoulos, C.C. Poon, W.P. Leung, N. Do and A.C. Tam, Optical Reflectance and Scattering Studies of Nucleation and Growth of Bubbles at a Liquid-Solid Interface Induced by Pulsed Laser Heating, Phys. Rev. Lett., vol. 70, No. 12, pp. 1830-1833 (1993).

A.C. Tam, H.K. Park and C.P. Grigoropoulos, Laser Cleaning of Surface Contaminants, Appl. Surf. Sci. 127-129, pp. 721-725 (1998).

J.B. Heroux, S. Boughaba, I. Ressejac, E. Sacher and M. Meunier, $CO_2$ laser-assisted removal of submission particles from solid surfaces, J. Appl. Phys. 79(6), pp. 2857-2862 (1996).

M. Mosbacher, H-J. Munzer, J. Zimmermann, J. Solis, J. Boneberg & P. Leiderer, Optical field enhancement effects in laser-assisted particle removal, Appl. Phys. A 72, pp. 41-44 (2001).

D.R. Halfpenny and D.M. Kaner, A quantitive analysis of single pulse ultraviolet dry laser cleaning, J. Appl. Phys. vol. 86, No. 12, pp. 6641-6646 (1999).

X. Wu, E. Sacher and M. Meunier, The modeling of eximer laser particle removal from hydrophilic silicon surfaces, J. Appl. Phys. vol. 87, No. 8, pp. 3618-3627 (2000).

G. Vereecke, E. Rohr and M.M. Heyns, Laser-assisted removal of particles on silicon wafers, J. Appl. Phys. vol. 85, No. 7, pp. 3837-3843 (1999).

Y.F. Lu, Y.W. Zheng, W.D. Song., An energy approach to the modelling of particle removal by pulsed laser irradiation, Appl. Phys. A 68, pp. 569-572 (1999).

K. Mann, B. Wolff-Rottke and F. Muller, Cleaning of optical surfaces by eximer laser radiation, Appl. Surf. Sci. 96-98, pp. 463-468 (1996).

J. Adler, R.K. Sin, Y. Rabinovich and B. Moudgil, "Adhesion between Nanoscale Rough Surfaces," *Journal of Colloid and Interface Science*, pp. 10-24 (Aug. 1999).

Q. Chen, H.W. Lee, S. Allen, Bubble Formation and Growth in Liquid Encapsulated Laser Vapor Deposition, *Tulane Laser Micro Fabrication Lab*, pp. 113-119.

A.C. Engelsberg, Transition from laboratory to manufacturing for a dry, laser-assisted cleaning technology, SPIE vol. 3274, pp. 100-109 (1998).

R.G. Horn, and D.T. Smith, Contact Electrification and Adhesion Between Dissimilar Materials, Science vol. 256, pp. 362-364 (1992).

M.Y. Hussaini, P. Rasetarinera, An efficient implicit discontinuous spectral Galerkin method, Journal of Computational Physics vol. 172, pp. 718-738 (2001).

K. Imen, S.D. Allen, S. Lee, Laser-assisted microscale particle removal, Appl. Phys. Lett. 58(2), pp. 203-205 (1991).

S.J. Lee, K. Imen, S.D. Allen, $CO_2$ Laser assisted particle removal threshold measurements, Appl. Phys. Lett. 61(19), pp. 2314-2316 (1992).

S.J. Lee, K. Imen, S.D. Allen, Shock wave analysis of laser particle removal, J. Appl. Phys. 74(12), pp. 7044-7047 (1993).

S.J. Lee, S.D. Allen, S. Miller, Materials Science Engineering B 49, p. 85 (1997).

P.T. Leung, N. Do, Leander Klees, W.P.Leung, Frank Tong, L. Lam, W. Zapka and A.C. Tam, Transmission studies of explosive vaporization of a transparent liquid film on an opaque solid surface induced by excimer-laser-pulsed irradiation, J. Appl. Phys. 72 (6), pp. 2256-2263 (1992).

Y.K. Lu, W.D. Song, K.D. Ye, Y.P. Lee, D.S.H. Chan and T.S. Low, A cleaning model for removal of particles due to laser-induced thermal expansion of substrate surface, Jpn. J. Appl. Phys. vol. 36, pp. L1304-L1306 (1997).

Y.K. Lu, W.D. Song, Y. Zhang, M.H. Hong, T.S. Low, A theoretical model for laser removal of particles from solid surfaces, Applied Physics A 65, pp. 9-13 (1997).

Y.K. Lu, Y.W. Zheng, and W.D. Song, Laser induced removal of spherical particles from silicon wafers, J.Appl. Phys. vol. 87, No. 3, pp. 1534-1539 (2000).

M. Mosbacher, N. Chaoui, J. Siegel, V. Dobler, J. Solis, J. Boneberg, C.N. Afonso, P. Liederer, A comparison of ns and ps steam laser cleaning of Si surfaces, Appl. Phys. A 69, pp. S331-S334 (1999).

M. Mosbacher, V. Dobler, J. Boneberg, P. Liederer, Universal threshold for the steam laser cleaning of submicron spherical particles from silicon, Appl. Phys. A70, pp. 669-672 (2000).

H.K. Park, C.P. Grigoropoulos, W.P. Leung, A.C. Tam, A practical excimer laser-based cleaning tool for removal of surface contaminants, IEEE Transactions on Components, Packaging and Manufacturing Technology—Part A, vol. 17, No. 4, pp. 631-643 (1994).

N.W. Pu, J. Bokor, S. Jeong, R. Zhao, Nondestructive ps-ultrasonic characterization of Mo/Si extreme UV multiplayer reflection coatings, J. Vac. Sci. Technol. B17 (6), pp. 3014-3523 (1999).

A.C. Tam, W.P. Leung, W. Zapka, W. Ziemlich, Laser-cleaning techniques for removal of surface particles, J. Appl. Phys. 71 (7), pp. 3515-3523 (1992).

O. Yavas, A. Schilling, J. Bischof, J. Boneberg, P. Leiderer, Bubble nucleation and pressure generation during laser cleaning of surfaces, Appl. Phys. A, 64, pp. 331-339 (1997).

S. Miller, Dusty Lab May Revolutionize LEDs, Photonics Technology World, p. 34, Sep. 2000.

\* cited by examiner

RELATED ART

APPARATUS FOR REMOVAL OF MINUTE PARTICLES FROM A SURFACE USING THERMOPHORESIS TO PREVENT PARTICLE REDEPOSITION

This application is a Continuation of prior application No. 09/909,992, filed Jul. 23, 2001, now U.S. Pat. No. 6,805,751, which is hereby incorporated by reference.

BACKGROUND OF THE INVENTION

1. Field of the Invention

The present invention relates to a method and apparatus for removing minute particles from a surface. More particularly, the invention relates to a method and apparatus for removing minute particles from a surface using thermophoresis to prevent particle redeposition.

2. Background of the Related Art

Particle contamination of surfaces is a concern in many areas of technology. Two areas where such contamination can be a very significant problem are optics, particularly those with critical optical surfaces, and electronic device fabrication. The effect of contaminants on critical optical surfaces (coated or uncoated, dielectric or metal), for example in high power laser optics, can lead to increased optical absorption and a decreased laser damage threshold. As minute particles contaminate optical surfaces, they can serve as sinks for optical power incident on the optical surfaces and thus produce localized heating and possible damage. Large telescope mirrors, and space optics are other applications which require highly decontaminated critical optical surfaces.

In the electronics industry, particle contamination is an important factor in the manufacture of high density integrated circuits. Even in relatively conventional technology using micron or larger circuit patterns, submicron size particle contamination can be a problem. Today the technology is progressing into submicron pattern sizes, and particle contamination is even more of a problem. For device fabrication, particles serve as "killer defects" for only the device that is particle contaminated. The term "device" includes electronic devices, including masks/reticles, optical devices, medical devices, and other devices where particle removal could be advantageous. A particle contaminated mask/reticle prints every device with a defect. At the shorter wavelengths being developed for the next generation of lithography, materials for a protective pellicle for the mask are not available, making particle removal techniques an essential technology in the future. Contaminant particles larger than roughly 10% of the pattern size can create damage, such as pinholes, which interfere with fabrication processes (such as etching, deposition and the like), and defects of that size are a sufficiently significant proportion of the overall pattern size to result in rejected devices and reduced yield. As an example, it has been found that the minimum particle size which must be removed in order to achieve adequate yield in a one Megabit chip (which has a pattern size of one micron) is about 0.1 microns.

Filtration (of air and liquid), particle detection, and contaminant removal are known techniques used in contamination control technology in order to address the problems outlined above. For example, semiconductor fabrication is often conducted in clean rooms in which the air is highly filtered, the rooms are positively pressurized, and the personnel allowed into the room are decontaminated and specially garbed before entry is allowed. In spite of that, the manufactured devices can become contaminated, not only by contaminants carried in the air, but also by contaminants created by the processes used to fabricate the devices.

Removal techniques for contaminants should provide sufficient driving force for removal but without destroying the substrate. Moreover, acceptable removal techniques should provide a minimum level of cleanliness in a reliable fashion. As the particle size decreases, the particle weight becomes less significant as compared to other adhesive forces binding the particle to the surface which it contaminates. Removal of such small particles can potentially damage the substrate.

In general, it has been found that submicron particles are the most difficult to remove. Many of the processes developed to clean integrated circuits, such as ultrasonic agitation, are not effective for micron and submicron particles and indeed, sometimes add contaminants to the substrate.

Figure 1:
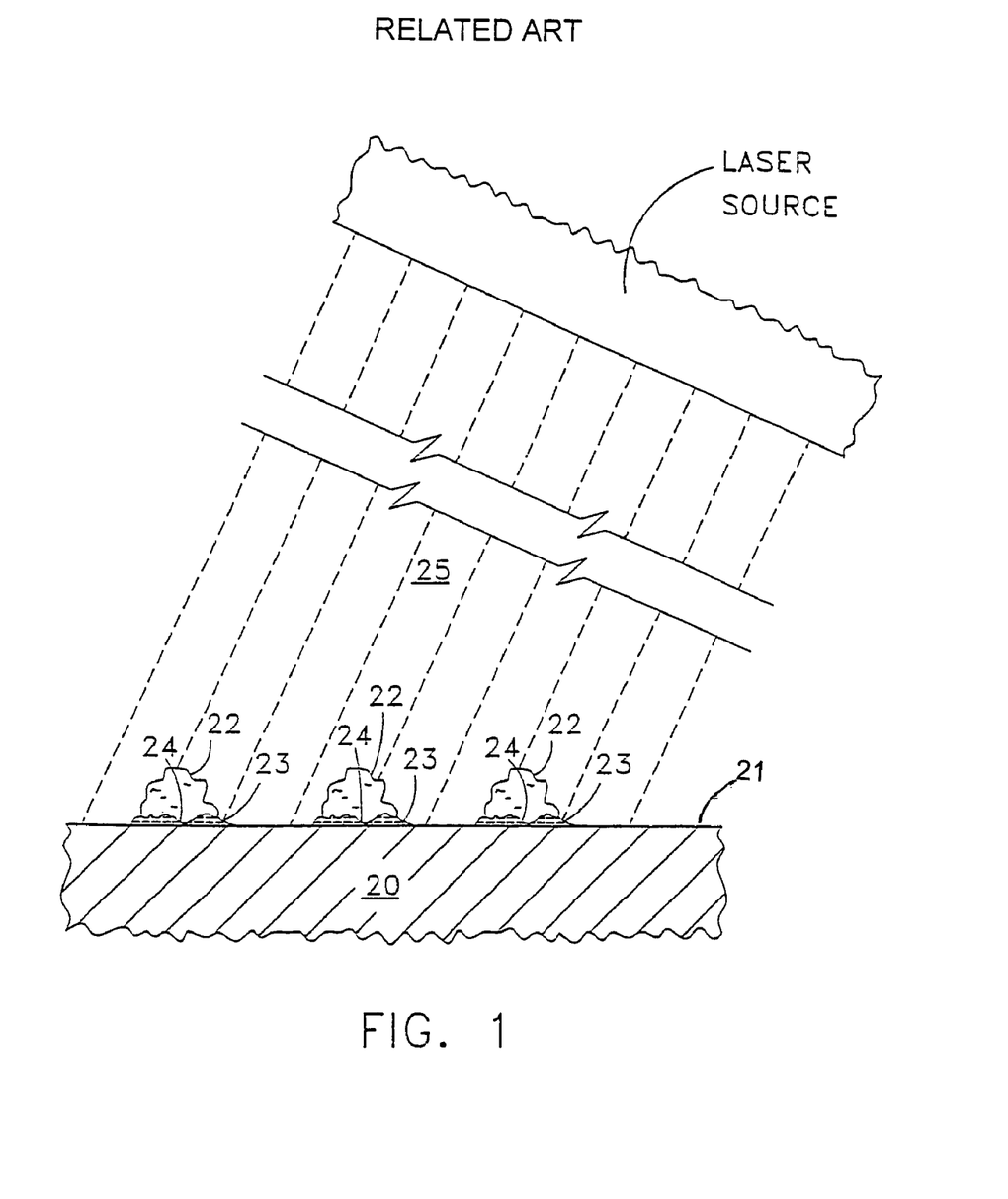
FIG. 1 is a diagram schematically illustrating a contaminated surface with adhered particles illustrating the practice of laser assisted particle removal.

Laser assisted particle removal has been described in U.S. Pat. No. 4,987,286 issued to Susan D. Allen on Jan. 22, 1991, which is hereby incorporated by reference. U.S. Pat. No. 4,987,286 discloses a method and apparatus for removing minute particles from a surface to which they are adhered using laser technology, and further teaches the use of an energy transfer medium to effect efficient laser assisted particle removal (LAPR). As shown in FIG. 1, a condensed liquid or solid energy transfer medium 23, such as water, is interposed under and around a contaminant particle 22 to be removed from a substrate 20 to which the particle is adhered. Thereafter, the medium 23 is irradiated using laser energy 25 at a wavelength which is strongly absorbed by the medium 23 causing explosive evaporation of the medium 23 with sufficient force to remove the particle 22 from the surface of the substrate.

Another particle removal technique has been to direct the laser energy into the substrate. The laser heated substrate then transfers energy into the energy transfer medium via conduction causing explosive evaporation sufficient to remove the particle from the surface of the substrate. The laser energy can also be directed into the particle(s) to be removed.

Both direct absorption by the energy transfer medium, and substrate and/or particle(s) absorption with subsequent heating of the energy transfer medium can result in efficient LAPR. However, advances in technology have decreased the critical dimensions of various devices, such as, for example, magnetic hard drives, semiconductor devices, masks to make semiconductor devices, etc., and have also increased the surface quality specifications for devices such as large telescope mirrors, space optics, high power laser optics, etc. Therefore, the ability to remove particulate contamination in a noncontact clean fashion becomes ever more important.

One of the challenges of LAPR and other particle removal methods is keeping the particles from redepositing on the surfaces, particularly for very small particles that are not significantly affected by gravity. Several options are available for preventing removed minute particles from redepositing on the cleaned surface. For example, when particles are removed in a vacuum, the mean free path of the particle is long enough to keep it from redepositing and a cooled surface can serve as a particle trap. Also, gas jets parallel to the surface can be used to entrain particles and transport them away from the critical surface.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

The invention provides a novel method and apparatus for removing minute (for example, micrometer and nanometer size) particles from a surface, and preventing their redeposition. By combining thermophoresis with laser assisted particle removal (LAPR), the present method and apparatus removes minute particles and assures that they will not redeposit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Co-pending U.S. application Ser. No. 09/909,993, which is hereby incorporated by reference, discusses and proposes methods and apparatus that efficiently remove minute particles from the surface of a substrate. The methods and apparatus according to the invention of Co-pending U.S. application Ser. No. 09/909,993 overcome the shortcomings of the prior art. However, as discussed above, one of the challenges of LAPR and other particle removal methods is keeping the particles from redepositing on the surfaces, particularly for very small (for example, micrometer and nanometer size) particles that are not significantly affected by gravity.

As previously discussed, FIG. 1 shows, in cross-section, a portion of a substrate 20 bearing contaminant particles 22 which are adhered to a surface 21. The particles 22 are bound to the surface 21 by any of a number of forces. The particles are deposited usually by a complex process which may include diffusion, sedimentation, inertia, and electrical or electrostatic attraction. When the particles are very small, gravity is a minor source of adhesion, and other sources of greater significance are Van der Waals forces, electrostatic forces, capillary forces, and the like. Adhesion forces and the factors necessary for dislodging particles held by such forces will be considered in greater detail below. As the particles become smaller, the adhesion force per particle contact surface area increases rapidly, and removal of such particles becomes a rather significant problem.

Figure 2A:
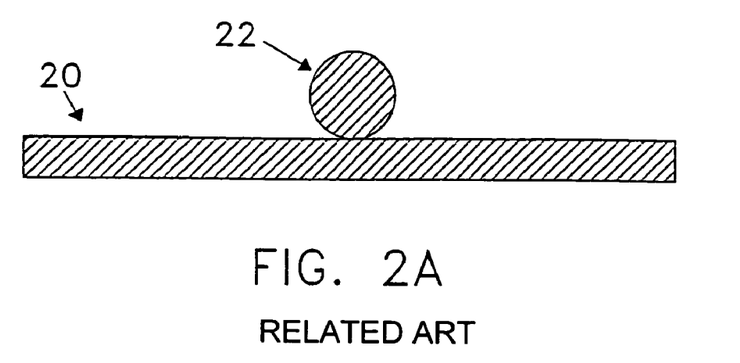
FIG. 2A is a diagram schematically illustrating a surface bearing a contaminant particle prior to introduction of an energy transfer medium thereon.
Figure 2B:
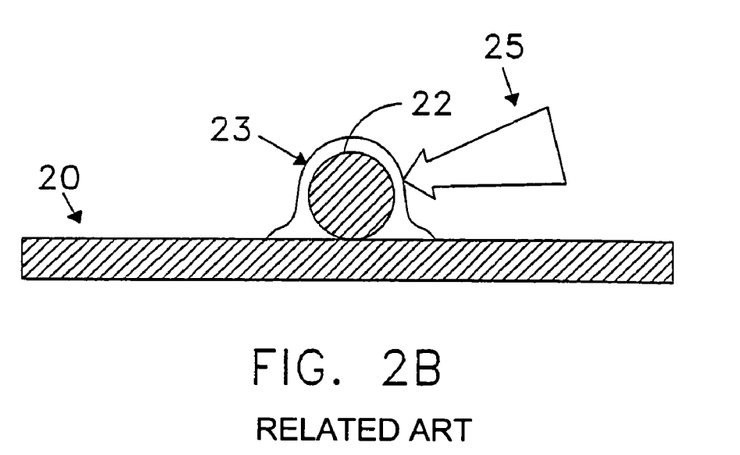
FIG. 2B is a diagram schematically illustrating the introduction of laser energy onto the contaminant particle.

An energy transfer medium (ETM) may be interposed under and around the particles 22, such medium being illustrated in the drawing as layer 23, which occupies interstices 24 formed between the adhered particles 22 and the surface 21. FIGS. 2A-2B illustrates the introduction of an ETM onto a surface bearing a contaminant particle.

After preparing the surface for cleansing, energy is impinged upon the surface to be cleaned. The energy may be targeted into, that is, at a wavelength which is absorbed by, the particle, the substrate, or the ETM, or some combination thereof.

Figure 2C:
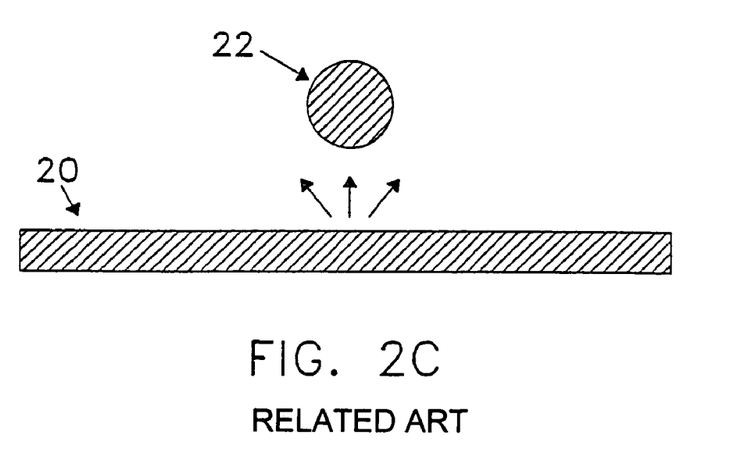
FIG. 2C is a diagram schematically illustrating the removal of the contaminant particle from the surface.

In the example of FIG. 1, a laser beam 25 is directed at the surface 21, which carries the contaminant particles, and the interposed layer 24. A quantity of energy is absorbed in the ETM, either directly or from the laser heated particle or substrate, which is sufficient to cause explosive evaporation on the medium. The quantity of material interposed under and around the particle is such that, when explosive evaporation occurs, the particle is driven from the surface by the force of the explosion, as shown in FIG. 2C. In effect, the laser energy incident on the surface is converted by the ETM from potential to kinetic energy, and is transferred to the particle, driving it from the surface to which it had been adhered.

The methods and apparatus according to the invention use thermophoresis to prevent the redeposition of dislodged particles onto the surface of a sample or substrate. It has been known that a temperature gradient in a gas causes small particles suspended in the gas to migrate in the direction of decreasing temperature. This phenomenon is called thermophoresis. The methods and apparatus according to the invention combine thermophoresis with laser assisted particle removal (LAPR) to remove difficult to remove particles from a surface of a sample and to prevent their redeposition.

Thermophoresis was discovered in the steel industry in 1910. A thermal gradient produces a net force on a particle small enough to exhibit Brownian motion toward the colder side of the gradient. This force exists because the hotter gaseous molecules near the surface that is being protected have more kinetic energy to impart to the small particle, tending to force it toward the colder part of the gas.

It has been demonstrated by Lenny Klebanoff, Dan Radar, and Daniel Dedrick at Sandia National Laboratories that a temperature gradient of approximately 15K/cm will prevent approximately 0.2 µm polystyrene particles flowing from a "showerhead" from depositing on a mask surface. This temperature gradient can be produced, for example, by cooling a plate above the surface to be protected, by heating the surface to be protected, or by some combination thereof. Pressures as low as approximately 30 mT can be utilized to create a thermophoretic force.

Experiments were also conducted by Klebanoff et al. for approximately 10K/cm temperature gradients in which a test wafer, protected by thermophoresis, was exposed to class ~7 million Ar gas at approximately 1 Torr pressure and laden with approximately 0.24 micron diameter particles. Post exposure scans of the wafer indicated particle protection factors in excess of $~10^6$. The model used by Klebanoff et al. indicated that the technique would work down to approximately 50 nm particles.

Obviously, there is no thermophoresis in vacuum, but there are many processes with particle surface contamination problems that operate in a gaseous environment at atmospheric, low or high pressure. The readily executable redeposition prevention process for use with LAPR according to the invention in atmosphere would be advantageous for many processes, including but not limited to cleaning semiconductor wafers and masks, cleaning high resolution optics such as large telescope mirrors, cleaning critical surfaces in space, cleaning high power laser optics, etc.

Figure 3A:
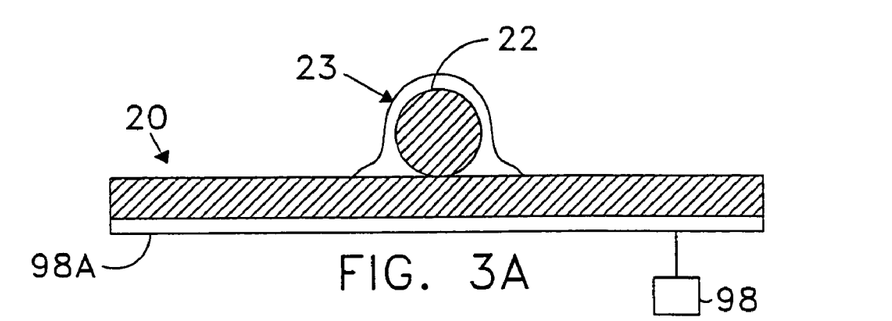
FIGS. 3A-3C schematically illustrate three exemplary ways in which the invention can be implemented.
Figure 3B:
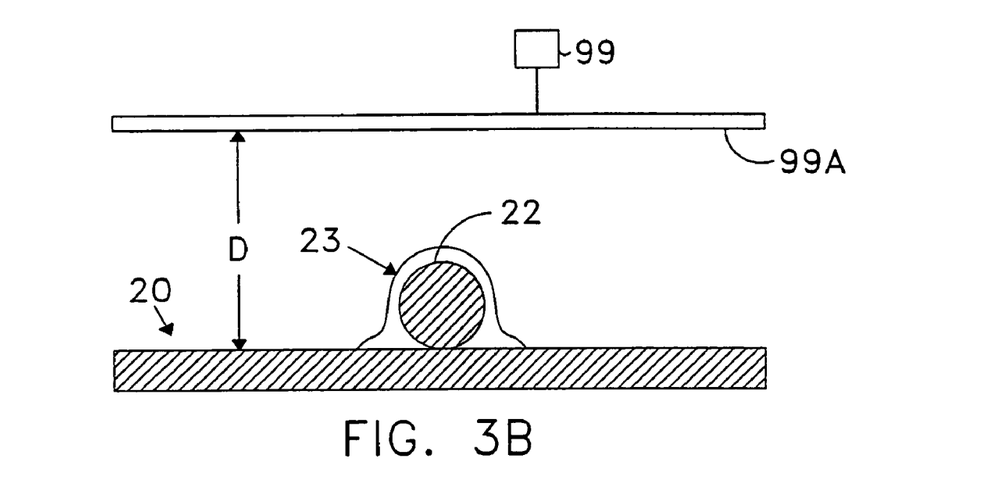
Figure 3C:
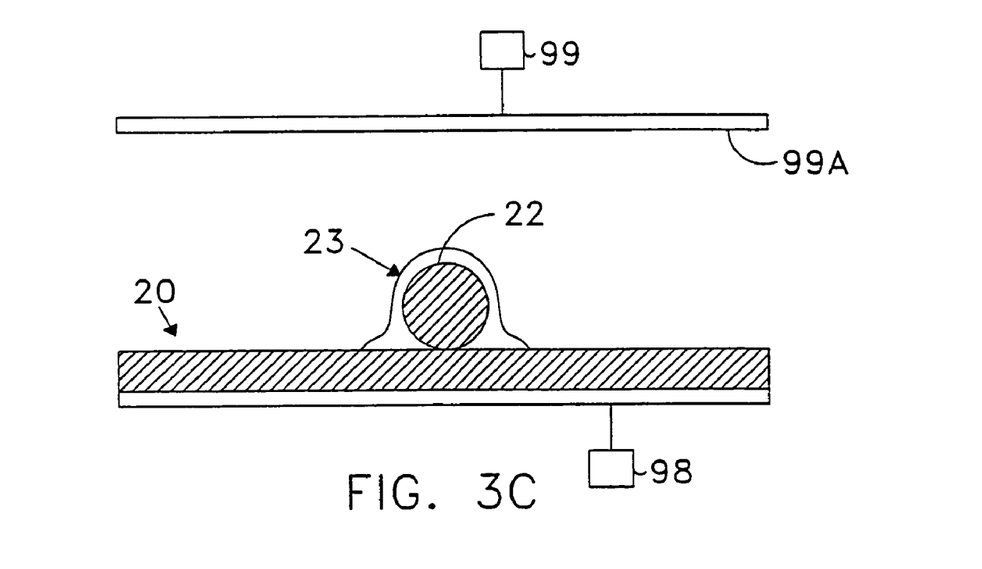

FIGS. 3A-3C schematically illustrate three exemplary ways in which the invention can be implemented. In FIG. 3A, a temperature control unit 98 is provided which controls the temperature of a plate 98A on which a sample or substrate 20 is placed. In FIG. 3B, a plate 99A and corresponding temperature control unit 99 are disposed above, or at a predetermined distance D from a sample or substrate 20. FIG. 3C illustrates an embodiment, which is a combination of the embodiments of FIGS. 3A-3B. By controlling the temperature control units 98 and/or 99, a temperature gradient can be created which will draw dislodged contaminant particles away from the surface of a sample or substrate 20 and ensure that they do not redeposit.

Further, temperature control units, such as those shown in FIGS. 3A-3B, can also be used to create a "particle gun". That is, the temperature control units could be manipulated to control the velocity and direction of particle flow. The velocity of the particles would be dependent on the temperature gradient as well as the size of the respective particles being manipulated. Such a particle gun concept could be used to accelerate particles toward a desired target.

Figure 4:
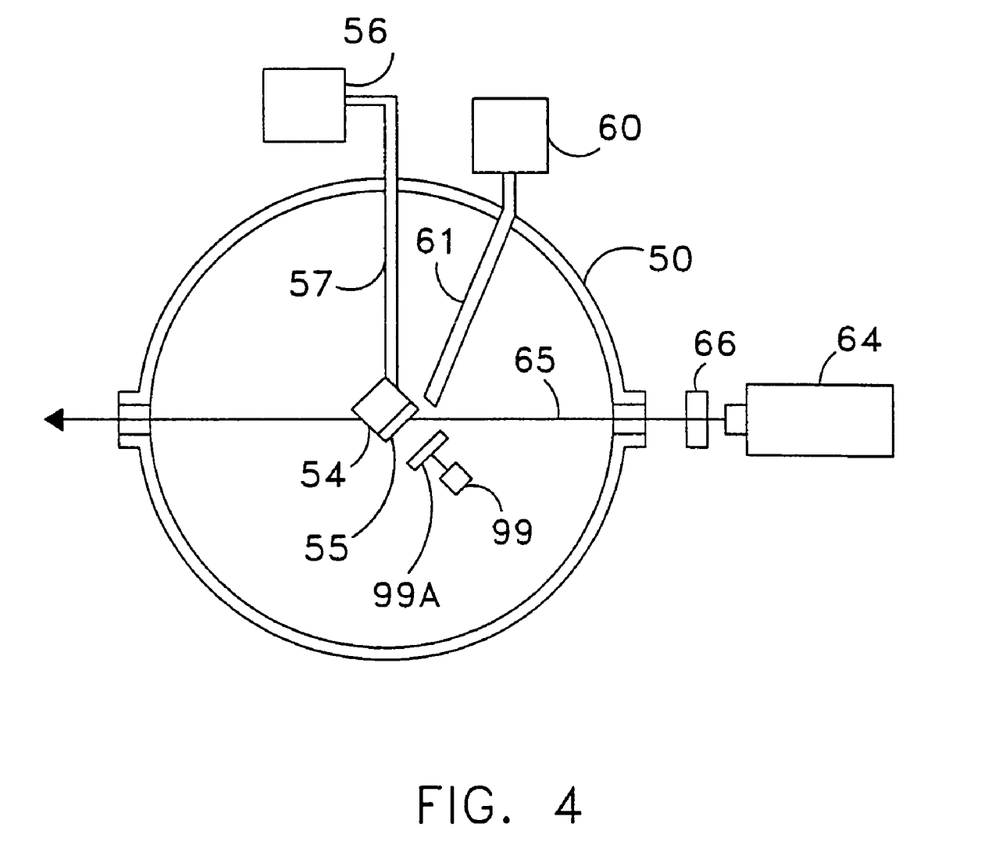
FIG. 4 is a schematic diagram of a system for performing the methods according to the present invention.

FIG. 4 shows an apparatus configured for practice according to one embodiment of the invention. The apparatus includes a chamber 50. Mounted on a support (not shown) in the chamber 50 is a substrate 54 to be cleaned. The substrate 54 has a surface 55 which contains contaminant particles (not shown in the scale of FIG. 4) which are to be removed.

For the purpose of controlling the adsorption and the description of liquid materials such as water, a cooling source 56 is coupled by conduit 57 to the substrate 54. As noted above, the temperature of the substrate 54 may be reduced to enhance water absorption to the surface 55.

An ETM can be applied as a liquid or gas. For the purpose of dosing the surface with a liquid ETM, for example, water or an alcohol/water mixture, a liquid source 60 is provided and is coupled by a dosing tube 61 to the surface 55 of the substrate 54. Liquid supplied by source 60 travels through the dosing tube 61 and is applied to the surface 55 at the appropriate temperature to assure adsorption on the surface and in interstices under and around the contaminant particles. After water dosing, the temperature of the substrate 54 can be maintained by the cooling source 56, such that adsorption of surface water occurs while maintaining water in the interstices under and around the contaminant particles and the surface.

A plate 99A and a corresponding temperature control unit 99 are provided at a predetermined distance from the substrate 54 to create a temperature gradient according to this embodiment of the invention. A laser source 64 is provided with means 66 for steering a laser beam 65, if necessary. Additional beam guiding means can be provided to guide the laser energy to the substrate 54 despite obstacles.

After a sample is prepared for cleaning, the laser source 64 is energized, and outputs pulses of energy in a beam illustrated at 65 to the surface 55. As an alternative, the sample itself can be moved within the chamber 50 to direct the laser beam to the desired area of the surface 55. In any event, the beam 65 is focused on areas of the surface 55 to be cleaned and the laser 64 pulsed to couple adequate energy to the surface 55.

As seen in FIG. 4, the sample 54 is mounted such that particles which are driven from the surface 55 can fall gravity assisted without redepositing on the surface. Additionally, the temperature control unit 99 creates a temperature gradient that ensures that the particles do not redeposit on the surface of the sample 54.

Figure 5:
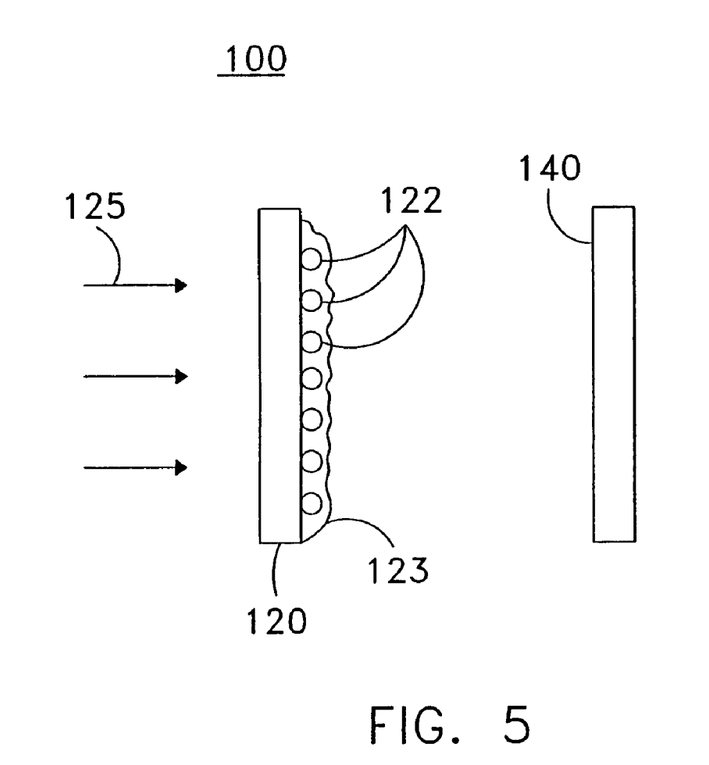
FIGS. 5-6 are schematic drawings of a particle gun according to the invention.
Figure 6:
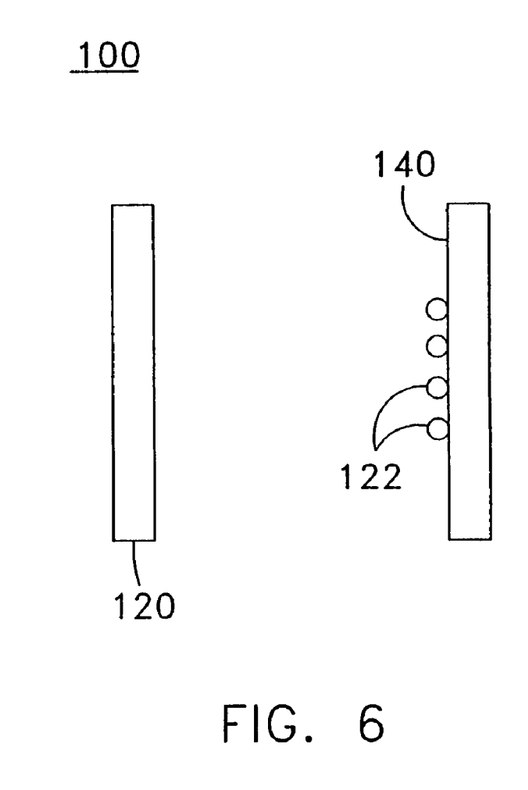

The present invention can also be used to form a particle gun, as mentioned briefly above, such as that shown in FIGS. 5-6, which would deposit particles onto a target substrate. This can be useful in the manufacture of, for example, computer monitors. Particles interposed between a mask and a polymer, during imprinting of a polymer based diode, will create rows of pillars, creating a photonic bandgap material. See "Dusty Lab May Revolutionize LEDs," Photonics Technology World, September 2000, which is hereby incorporated by reference. Fine control of the height and distribution of the pillars allows control of colors emitted by an LED, which are determined by microcavities in the polymer. See id. Instead of manufacturing each color with different light-emitting materials, the entire range of color can be produced with one material by controlling the height and distribution of the pillars. See id.

The particle gun according to the invention, discussed above and shown in FIGS. 5-6, can be used to deposit particles on a substrate in a predetermined pattern and/or in layers. For example, transparent tape can be used with different kinds, sizes, etc. of particles disposed on the tape at different portions thereof. The tape can then be moved into the path of the laser energy to expose different portions of the tape to the laser energy.

The particle gun 100 in FIG. 5 includes a substrate 120, and an energy transfer medium 123 with particles 122 deposited thereon. Laser energy 125 provided by a laser (not shown) is directed at the substrate/ETM combination. The particles 122 are accelerated from the surface of the substrate 120 towards a target substrate 140, upon which the particles 122 adhere as shown in FIG. 6. The temperatures of the substrate 120 and the target substrate 140 can be altered to affect particle deposition density and particle deposition distribution patterns. For example, the substrate 120 can be cold relative to a warm target substrate 140, preventing ETM redeposition on the target substrate 140 resulting in dry particle deposition.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. Apparatus for removing one or more particle(s) adhered to a surface of a sample, comprising:

means for arranging an energy transfer medium under and around the one or more particle(s);

means for irradiating the one or more particle(s), the surface, the sample and/or the energy transfer medium with laser energy to absorb sufficient energy in the one or more particle(s), the surface, the sample and/or the energy transfer medium to dislodge the one or more particle(s); and means for creating a temperature gradient separate from the means for irradiating, wherein the temperature gradient is perpendicular to and extending along substantially the entire surface, wherein the temperature gradient decreases in temperature as a distance from the surface increases sufficient to prevent the one or more particle(s) from redepositing on the surface, the means for creating a temperature gradient comprising a first plate adjacent to the sample having a temperature controlled by at least one temperature control unit, and a second plate positioned a predetermined distance from the sample having a temperature controlled by the at least one temperature control unit and configured to work in cooperation with the at least one temperature control unit and the first plate to create the temperature gradient.

2. Apparatus for removing one or more particle(s) adhered to a surface of a sample, comprising:

a support configured to support one or more particle(s)/sample and/or energy transfer medium combination;

a laser configured to irradiate the one or more particle(s)/sample and/or energy transfer medium combination with laser energy; and at least one temperature control unit configured to create a temperature gradient perpendicular to and extending along substantially the entire surface sufficient to prevent a particle dislodged from the surface of the sample from redepositing on the surface, wherein the at least one temperature control unit controls the temperature gradient, wherein the temperature gradient decreases in temperature as a distance from the surface increases, wherein a plate having a temperature controlled by the at least one temperature control unit is positioned a predetermined distance from the support and the apparatus further comprises a second temperature control unit and a second plate that is adjacent to the sample and coupled together and configured to work in cooperation with the at least one temperature control unit to create a temperature gradient perpendicular to and extending along the surface lengthwise sufficient to prevent a particle dislodged from the surface of the sample from redepositing on the surface.

3. The apparatus according to claim 2, wherein the temperature gradient is in a gas environment over the surface.

4. The apparatus according to claim 3, wherein the temperature gradient is substantially static.

5. The apparatus according to claim 3, wherein the means for creating a temperature gradient is separate from the means for irradiating.

\* \* \* \* \*